US010050612B1

United States Patent
Toops

(10) Patent No.: US 10,050,612 B1
(45) Date of Patent: Aug. 14, 2018

(54) RESISTOR-CAPACITOR (RC) DELAY CIRCUIT WITH A PRECHARGE MODE

(71) Applicant: TEXAS INSTRUMENTS INCORPORATED, Dallas, TX (US)

(72) Inventor: David J. Toops, Lucas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/481,053

(22) Filed: Apr. 6, 2017

(51) Int. Cl.
    *H03K 5/159* (2006.01)
    *H04N 5/335* (2011.01)
    *H03K 5/13* (2014.01)
    *H03H 11/26* (2006.01)
    *H03K 3/0231* (2006.01)
    *G11C 8/10* (2006.01)
    *G11C 5/14* (2006.01)
    *H03K 5/00* (2006.01)

(52) U.S. Cl.
    CPC ... *H03K 5/159* (2013.01); *H03K 2005/00195* (2013.01)

(58) Field of Classification Search
    CPC ......... H03K 5/159; H03K 2005/00195; H03K 5/13; H03K 3/0231; H04N 5/335; H03H 11/26; G11C 8/10; G11C 5/14
    USPC .................................................. 327/261–333
    See application file for complete search history.

(56) References Cited

U.S. PATENT DOCUMENTS

| | | | | |
|---|---|---|---|---|
| 5,175,452 A * | 12/1992 | Lupi | ...................... | H03K 5/133 327/262 |
| 6,040,610 A * | 3/2000 | Noguchi | ............. | H01L 21/8238 257/314 |
| 6,888,763 B1 * | 5/2005 | Guo | ........................ | G11C 5/145 331/175 |
| 7,642,833 B1 * | 1/2010 | Smith | ................... | H03H 11/265 327/262 |
| 7,663,945 B2 * | 2/2010 | Takahashi | .............. | G11C 5/145 365/194 |
| 7,733,146 B2 * | 6/2010 | Von Thun | .............. | H03H 11/26 327/100 |
| 7,932,764 B2 * | 4/2011 | Chou | ...................... | H03K 5/133 327/108 |
| 9,166,569 B2 * | 10/2015 | Luo | ...................... | H03K 3/0231 |

(Continued)

*Primary Examiner* — Brandon S Cole
(74) *Attorney, Agent, or Firm* — Rose Alyssa Keagy; Charles A. Brill; Frank D. Cimino

(57) ABSTRACT

A delay circuit includes precharge and discharge transistors configured to receive an input signal. The delay circuit also includes a resistor coupled to the precharge transistor having a negative temperature coefficient to thereby form a node. A capacitive device and an inverter are coupled to the node. The inverter produces an output signal. Responsive to the input signal having a first polarity, the precharge transistor is configured to be turned on and the discharge transistor is configured to be turned off to thereby cause current to flow through the precharge transistor to the capacitive device to thereby charge the capacitive device. Responsive to the input signal having a second polarity, the precharge and discharge transistors are configured to change state to thereby cause charge from the capacitive device to discharge through the resistor and through the discharge transistor. The voltage on the node decays to a level which eventually causes the inverter's output to change state.

18 Claims, 2 Drawing Sheets

(56) References Cited

U.S. PATENT DOCUMENTS

| | | | | |
|---|---|---|---|---|
| 2002/0021159 A1* | 2/2002 | Takahashi | .............. | H03K 5/133 |
| | | | | 327/283 |
| 2003/0231034 A1* | 12/2003 | Koch, II | .......... | H03K 17/08122 |
| | | | | 327/112 |
| 2006/0119716 A1* | 6/2006 | Noguchi | .............. | H04N 5/3577 |
| | | | | 348/297 |
| 2006/0229716 A1* | 10/2006 | Mitrev | ................. | A61B 5/1072 |
| | | | | 623/2.11 |
| 2007/0296479 A1* | 12/2007 | Takahashi | ............ | H03H 11/265 |
| | | | | 327/277 |
| 2009/0256612 A1* | 10/2009 | Rho | ......................... | G11C 7/08 |
| | | | | 327/276 |
| 2012/0306553 A1* | 12/2012 | Kim | ....................... | H03M 1/06 |
| | | | | 327/158 |
| 2016/0307613 A1* | 10/2016 | Zhang | ...................... | G11C 8/10 |
| 2017/0033778 A1* | 2/2017 | Chi | .......................... | H03K 5/14 |

\* cited by examiner

US 10,050,612 B1

RESISTOR-CAPACITOR (RC) DELAY CIRCUIT WITH A PRECHARGE MODE

BACKGROUND

Delay circuits are used in wide variety of applications. Responsive to receipt of an input signal, a delay circuit generates an output signal after a predefined period of time. The time delay implemented by a given delay circuit, however, may vary over process, voltage and temperature (PVT). That is, to a degree the length of the time delay may depend on the supply voltage, on the temperature in which the circuit is operating and on the semiconductor processing used to manufacture the circuit.

SUMMARY

In accordance with at least one embodiment, a delay circuit may include a precharge transistor configured to be coupled to a supply voltage rail and configured to receive an input signal. The delay circuit also may include a resistor, a discharge transistor, a capacitive device, and an inverter. The resistor may be coupled to the precharge transistor to thereby form a node. The resistor may have a negative temperature coefficient. The discharge transistor may be coupled to the resistor and configured to receive the input signal. The capacitive device and the inverter may be coupled to the node. The inverter may be configured to produce an output signal. Responsive to the input signal having a first polarity, the precharge transistor is turned ON and the discharge transistor is turned OFF to thereby cause current to flow from the supply voltage rail and through the precharge transistor to the capacitive device to thereby charge the capacitive device. Responsive to the input signal having a second polarity, the precharge transistor may be turned OFF and the discharge transistor may be turned ON to thereby cause charge from the capacitive device to discharge through the resistor and through the discharge transistor.

In another embodiment, a circuit may include a precharge transistor configured to be coupled to a supply voltage rail and configured to receive an input signal. A resistor may be coupled to the precharge transistor to thereby form a node. A discharge transistor may be coupled to the resistor and configured to receive the input signal. A capacitive device may be coupled to the node. Responsive to the input signal having a first polarity, the precharge transistor may be turned ON and the discharge transistor may be turned OFF to thereby cause current to flow from the supply voltage rail and through the precharge transistor to the capacitive device to thereby charge the capacitive device. Further, responsive to the input signal having a second polarity, the precharge transistor may be turned OFF and the discharge transistor turned ON to thereby cause charge from the capacitive device to discharge through the resistor and through the discharge transistor.

In yet another embodiment, a delay circuit may include a precharge transistor, a discharge transistor, a resistor, a capacitive device, and an inverter. The precharge transistor may be configured to be coupled to a supply voltage rail and to receive an input signal. The resistor may be coupled to the precharge transistor to thereby form a node. The resistor may have a negative temperature coefficient. The discharge transistor may be coupled to the resistor and configured to receive the input signal. The capacitive device may be coupled to the node. The inverter may be coupled to the node and configured to produce an output signal. A first reset switch also may be included and coupled to the node and configured to receive a reset signal. The precharge transistor may comprise one of a p-channel device or an n-channel device and the discharge transistor may comprise the other of the p-channel device or the n-channel device.

In another embodiment, a method may include configuring a delay circuit for a precharge mode of operation in which a capacitive device is charged thereby forcing a charge node within the delay circuit to be at a logic high level. The method also may include detecting a change in a logic level of an input signal. Responsive to the detected change in the logic level of the input signal, the method may include reconfiguring the delay circuit for a discharge mode of operation in which charge from the capacitive device is discharged through a resistor to a common voltage rail to thereby cause a voltage on the charge node to decrease. Further, responsive to a voltage level of the voltage on the charge node becoming a logic low level, the method may include changing an output signal from a first logic state to a second logic state.

BRIEF DESCRIPTION OF THE DRAWINGS

For a detailed description of various examples, reference will now be made to the accompanying drawings in which.

DETAILED DESCRIPTION

A delay circuit is described herein whose time delay has less variation with PVT than other delay circuits. In one example, the delay circuit may include a precharge switch, a discharge switch, a resistor, a capacitive device, and an inverter. One or more additional switches may be present as well to provide a reset function for the delay circuit. The delay circuit is configured to receive an input signal (e.g., an input signal that transitions from a logic low to a logic high, that is a rising edge) and the output of the inverter replicates the rising edge but following a time delay largely controlled by the component values of the resistor and the capacitive device.

The precharge switch may be coupled to a supply voltage rail and may be configured to receive the input signal. The resistor couples between the precharge switch and the discharge switch to form an internal node of the delay circuit. In some embodiments, the resistor has a negative temperature coefficient (i.e., its resistance varies inversely with temperature). The discharge switch is also configured to receive the input signal. The precharge switch may comprise a p-channel device and the discharge switch may comprise an n-channel device, which means that because they receive the same input signal to their gates, the precharge and discharge switches are not both on at the same time (i.e., while one is on, the other is off, and vice versa). The capacitive device and the inverter are coupled to the node as well.

During an inactive state of the input signal (e.g., the input signal being at a logic low level and before an active generation of a rising edge), the precharge switch (also termed a precharge transistor) is on and the discharge switch (also termed a discharge transistor) is off which thereby causes current to flow from the supply voltage rail and through the precharge switch to the capacitive device to charge the capacitive device. The voltage on the node is thus high. Responsive to the input signal transitioning to a logic high level, the precharge switch turns off and the discharge switch turns on to cause charge from the capacitive device to discharge through the resistor and the discharge switch to ground. Thus, as the input signal transitions from low to high, the node voltage (i.e., the voltage on the capacitive device) transitions from high (resulting from its precharge state) to low at a rate controlled by the product of the resistance value (R) of the resistor and the capacitance (C) of the capacitive device. The inverter then inverts the node's high to low transition back to the same polarity as the input signal's low to high transition.

Figure 1:
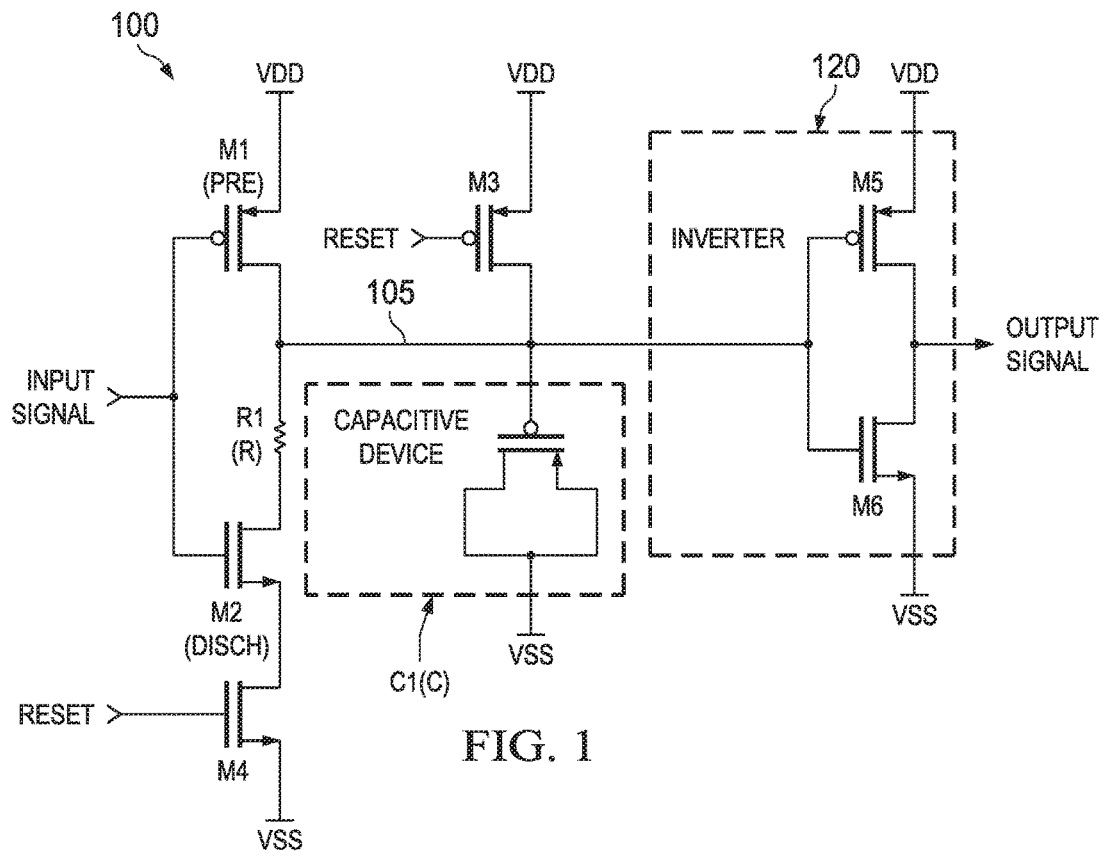
FIG. 1 shows a delay circuit in accordance with various examples.

FIG. 1 shows an example of a delay circuit 100 in accordance with various embodiments. The illustrative delay circuit 100 includes transistors M1, M2, M3, M4, M5, and M6, a resistor R1, and a capacitive element C1. The transistors M5 and M6 form an inverter 120. In this example, transistors M1, M3, and M5 are implemented as p-channel devices and transistors M2, M4 and M6 are implemented as n-channel devices. In other embodiments, the transistors can be implemented as other than the specific channel type devices illustrated in FIG. 1. The voltage node $V_{DD}$ in FIG. 1 may comprise a positive supply voltage rail and $V_{SS}$ may comprise a common voltage rail (e.g., ground).

The capacitive device C1 may be implemented as a p-channel transistor as shown, an n-channel transistor, or a capacitor. In the configuration shown, the capacitive device is a p-channel transistor whose source and drain terminals are connected together to form a capacitor. The source and drain terminals are connected to $V_{SS}$.

Transistor M1 functions as a precharge transistor to charge capacitive device C1 (and thus is designated in FIG. 1 as a precharge (PRE) transistor) and couples between $V_{DD}$ and a terminal of resistor R1. The opposing resistor terminal is coupled to transistor M2 which functions to discharge the capacitive device C1 (and thus is designated in FIG. 1 as a discharge (DISCH) transistor). The gates of M1 and M2 are connected together in this example and are configured to receive an input signal as shown.

The illustrative delay circuit 100 also includes a reset capability that is implemented by transistors M3 and M4. The circuit is caused to be reset responsive to a RESET signal provided to the gates of M3 and M4 being low. Resetting the circuit may cause the output signal to transition back to the inactive state (e.g., low). When not actively resetting the circuit, RESET is high. Discharge transistor M2 is coupled to reset transistor M4, which also couples to $V_{SS}$. The other reset transistor M3 couples between VDD and the capacitive device C1. The node interconnecting M1, M3, R1 and C1 is labeled as 105 in FIG. 1.

The example delay circuit of FIG. 1 also includes an inverter 120. In this example, the inverter 120 comprises a pair of transistors including transistors M5 and M6. Transistor M5 may comprise a p-channel device and transistor M6 may comprise an n-channel device. The gates of M5 and M6 are connected together and connected to node 105. Further, the drains of M5 and M6 are connected together to provide an output signal from the delay circuit 100. The inclusion of inverter 120 causes the delay circuit 100 to function as a non-inverting delay circuit in which the output voltage tracks the input voltage, albeit with a time delay as described herein.

In operation, an edge of the input signal (e.g., a rising edge) is replicated as the output signal but after a time delay that is largely caused by the RC time constant implemented by the resistor R1 and capacitive device C1. The delay circuit 100 can be implemented with a variety of time delays through selection of various combinations of resistance R and capacitance C values for resistor R1 and capacitive device C1, respectively. In some embodiments, the resistor R1 has a negative temperature coefficient, which means its resistance R varies inversely with temperature—increases in temperature results in lower R, and vice versa. The negative temperature coefficient for R1 helps to reduce the variation in the delay circuit's time delay with temperature. That is, because other components in the time delay circuit 100 may exhibit a positive correlation with temperature (e.g., switching speeds of the transistors may decrease with increases in temperature, the capacitance C of capacitive device C1 may be positively correlated with temperature, etc.), to a certain extent selection of R1 to have a negative correlation with temperature counteracts the temperature effects of the other components. In some embodiments, the temperature coefficient of R1 may be a value that is equal to or more negative than −50 parts per million (ppm) per degree Celsius. In one example, the negative temperature coefficient of R1 is −234 ppm/C. The capacitive device C1 may have a large size relative to the smallest feature size of the semiconductor process. As such, process variation of the time delay generated by the circuit will be reduced. Using a resistor and a capacitive device (RC) for the delay removes the large variation that a transistor-based time delay would provide. In some examples, the variation of the time delay across PVT may be approximately 1.5:1.

In operation, the illustrative delay circuit 100 may be capable of multiple modes of operations including, for example, a precharge mode in which the capacitive device C1 is charged, a discharge mode in which the charge on the capacitive device discharges through the resistor, and a reset mode. These modes of operation are illustrated in FIGS. 2, 3A, 3B, and 4, respectively. The transistors in these figures are depicted conceptually by switch symbols and the inverter 120 also is shown by an inverter symbol. Further, the capacitive device C1 is shown by a capacitor symbol.

Figure 2:
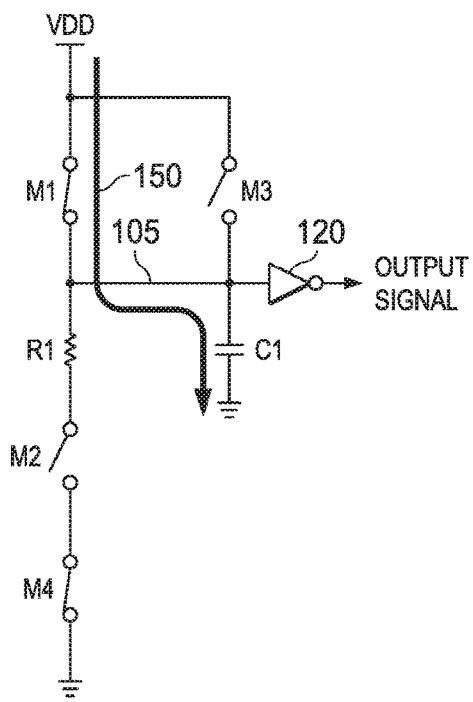
FIG. 2 shows the operation of the delay circuit in a precharge mode in accordance with various examples.

FIG. 2 illustrates the precharge mode of operation of the delay circuit. The delay circuit is configured for this mode responsive to the input signal being in an inactive state and awaiting an edge. In the example described herein, the inactive state for the input signal is a logic low (0). The input signal being low causes the precharge transistor M1 to be ON and the discharge transistor M2 to be OFF. Further, the RESET signal for this mode of operation is set a logic high level (1) which results in reset transistors M3 being OFF and M4 being ON. Thus, in the precharge mode the input signal is low and the reset signal is high which causes M1 and M4 to be ON and M2 and M3 to be OFF, as shown in FIG. 2.

In the precharge mode, current from the positive power rail $V_{DD}$ flows through the precharge transistor M1 to the capacitive device C1 as depicted by arrow 150. The capacitive device C1 thus charges and the voltage on node 105 becomes a positive voltage level and is detected by inverter 120 as a logic high. The inverter 120 inverts the logic high on node 105 to a logic low for the output signal. While the delay circuit remains in the precharge mode (while the input signal is low), the node 105 has a positive voltage (high signal level) and the capacitive device C1 is charged.

Figure 3A:
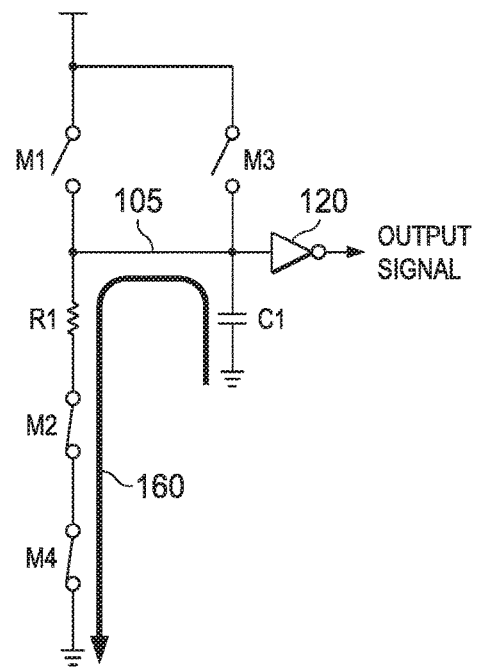
FIG. 3A shows the operation of the delay circuit in a discharge mode in accordance with various examples.

Referring now to FIG. 3A, the input signal then may transition from low to high. The input signal being high causes the precharge transistor M1 to be OFF and the discharge transistor M2 to be ON. The RESET signal remains at a logic high level causing M3 and M4 to remain OFF and ON, respectively. The charge current path from $V_{DD}$ to the capacitor is disrupted due to M1 being OFF, but a discharge current path 160 is created from the capacitive device C1 through the resistor R1 to VSS (illustrated in FIG. 3 as a ground potential). The rate at which the capacitor discharges is dictated by the product of R and C.

Figure 3B:
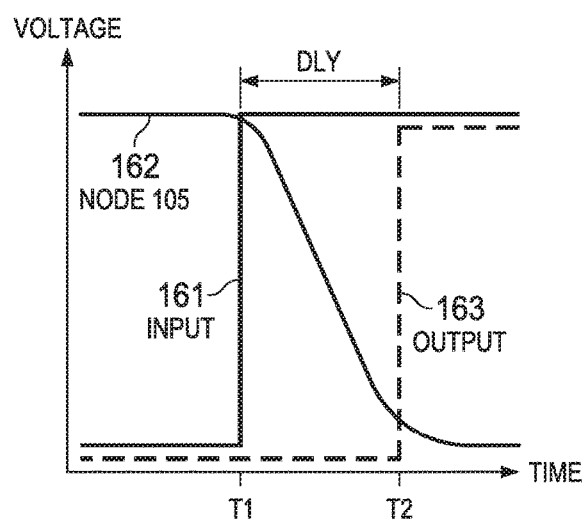
FIG. 3B shows a timing diagram of the delay circuit during the discharge mode of operation in accordance with various examples.

The waveforms 161, 162, and 163 in FIG. 3B further illustrate the operation of the delay circuit. Waveform 161 represents the input signal and illustrates the input signal transitioning from a logic low to a logic high at time T1. Waveform 162 represents the voltage on node 105. Up until T1, the node 105 voltage is a logic high. The node 105 voltage begins to decay toward a logic low level when the input signal becomes high and creates the discharge current path 160. The voltage on node 105 decays at a rate dictated by the product of R and C. Waveform 163 represents the voltage of the output signal. As the delay circuit 100 is a non-inverting delay circuit, the output voltage is low while the input voltage is low. The output signal remains at a logic low level despite the input signal becoming high. The voltage on node 105, which is provided as input to the inverter 120, begins to drop as shown. When the node 105 voltage falls to a low enough level to be interpreted as a logic low by the inverter 120, the output of the inverter (i.e., the output signal of the delay circuit 100) transitions from low to high as shown at time T2. The difference between T2 and T1 is shown in FIG. 3B as DLY and is controlled by the value of RC.

Figure 4:
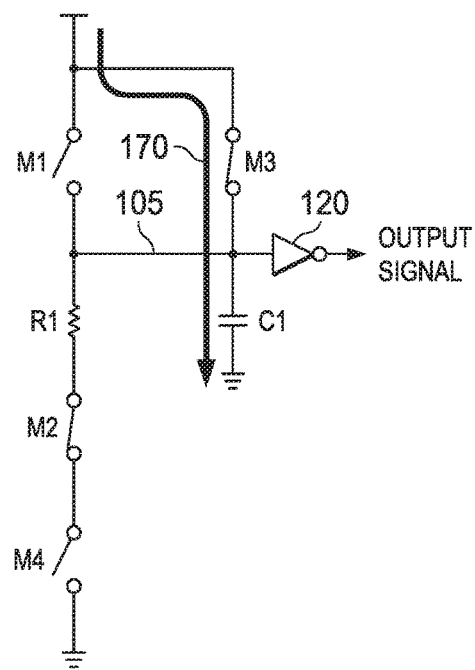
FIG. 4 shows the operation of the delay circuit in a reset mode in accordance with various examples.

The output signal will remain at a logic high level as long as the input signal is a logic high level. In some cases, it may be desired to reset the delay circuit to thereby force the output signal to again become a logic low level despite the input signal being at logic high level. FIG. 4 shows the operation of the delay circuit during a reset mode of operation. To reset the output signal, the RESET signal is forced to a logic low level, which causes reset transistor M3 to be ON and reset transistor M4 to be OFF as shown. With M3 being ON, a charge current path 170 forms to provide charge current from the positive supply rail $V_{DD}$ through transistor M3 to the capacitive device C1. As the capacitive device C1 begins to charge, the voltage on node 105 begins to increase to the point at which the inverter 120 detects the node 105 voltage to be at a logic high level. The inverter 120 then inverts the high node 105 voltage thereby forcing the output signal to be a logic low signal.

In some implementations, multiple delay circuits 100 may be serially cascaded together, with the output signal from one delay circuit provided as the input signal to the next delay circuit in sequence. As the time delays implemented by each delay circuit aggregates to cause a larger delay between the input signal to the first delay circuit in the serial chain and the output signal from the last delay circuit in the chain.

Figure 5:
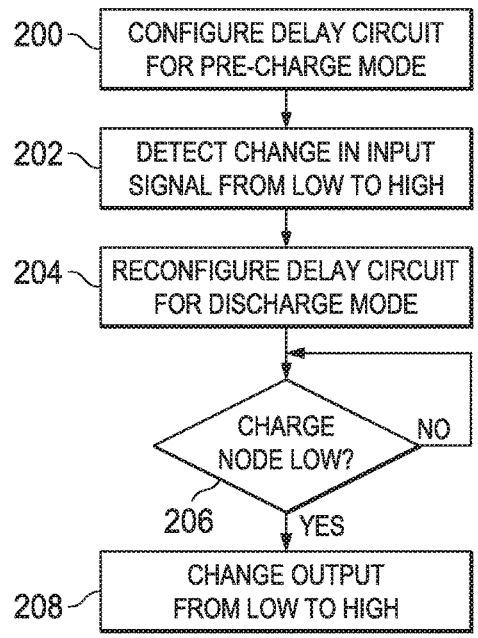
FIG. 5 shows a method embodiment in accordance with various examples.

FIG. 5 shows a flow chart illustrating a method in accordance with various embodiments. The operations may be performed in the order shown, or in a different order. Further, the operations may be performed sequentially, or two or more of the operations may be performed concurrently.

At 200, the method may include configuring the delay circuit for the precharge mode of operation. This operation may be implemented, for example, by turning various transistor switches ON and OFF based on the logic state of the input signal. In the example above, transistors M1 and M4 are turned ON and transistors M2 and M3 are turned OFF. As a result, current flows to the capacitive device and the voltage on node 105 (reference in FIG. 5 as charge node) becomes high.

At 202, the method may include detecting a change in the input signal voltage level from a logic low to a logic high (or vice versa in other embodiments of the delay circuit). Responsive to that detection being made, the delay circuit is reconfigured at 204 for the discharge mode of operation. While in the discharge mode of operation, the capacitive device begins to discharge and the voltage on the charge mode begins to drop.

At 206, the method may include determining when the charge node becomes a logic low level. After a time delay period of time, the charge node voltage will be determined to be a logic low level. As a result, at 208, the method may comprise changing the output signal voltage level from its former state to an opposing polarity (e.g., from logic low to logic high).

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A delay circuit, comprising:
   a precharge transistor coupled to a supply voltage rail and configured to receive an input signal;
   a resistor coupled to the precharge transistor to thereby form a node, wherein the resistor has a negative temperature coefficient;
   a discharge transistor coupled to the resistor and configured to receive the input signal;
   a capacitive device coupled to the node; and
   an inverter coupled to the node and configured to produce an output signal;
   wherein, responsive to the input signal having a first polarity, the precharge transistor is configured to be turned on and the discharge transistor is configured to be turned off to thereby cause current to flow from the supply voltage rail and through the precharge transistor to the capacitive device to thereby charge the capacitive device; and
   wherein, responsive to the input signal having a second polarity, the precharge transistor is configured to be turned off and the discharge transistor is configured to be turned on to thereby cause charge from the capacitive device to discharge through the resistor and through the discharge transistor.

2. The delay circuit of claim 1, wherein the capacitive device comprises a transistor.

3. The delay circuit of claim 1, further comprising:
   a first reset switch coupled to the node and to the supply voltage rail, wherein the first reset switch is configured to be controlled by a reset signal; and
   a second reset switch coupled to the discharge switch and to a common voltage rail, wherein the second reset switch is configured to be controlled by the reset signal;
   wherein the first reset switch is turned on with the reset signal at a first polarity and the second reset switch is turned on with the reset signal at a second polarity; and
   wherein, when the first reset switch is turned on by the reset signal, current is caused to flow from the power supply rail through the first reset switch and to the capacitive device to thereby increase the voltage on the node and cause the output signal from the inverter to change logic state.

4. The delay circuit of claim 1, wherein the negative temperature coefficient of the resistor is equal to, or more negative than, −50 parts per million per unit of temperature.

5. The delay circuit of claim 1, wherein the precharge transistor comprises a p-channel metal oxide semiconductor field effect transistor (MOSFET), and the discharge transistor comprises an n-channel MOSFET.

6. A circuit, comprising:
a precharge transistor configured to be coupled to a supply voltage rail and configured to receive an input signal;
a resistor coupled to the precharge transistor to thereby form a node, the resistor having a negative temperature coefficient;
a discharge transistor coupled to the resistor and configured to receive the input signal; and
a capacitive device coupled to the node;
wherein, responsive to the input signal having a first polarity, the precharge transistor is configured to be turned on and the discharge transistor is configured to be turned off to thereby cause current to flow from the supply voltage rail and through the precharge switch to the capacitive device to thereby charge the capacitive device; and
wherein, responsive to the input signal having a second polarity, the precharge transistor is configured to be turned off and the discharge transistor is configured to be turned on to thereby cause charge from the capacitive device to discharge through the resistor and through the discharge transistor.

7. The circuit of claim 6, further comprising an inverter coupled to the node and configured to produce an output signal that is asserted after a time delay from assertion of the input signal.

8. The circuit of claim 6, wherein the capacitive device comprises a transistor.

9. The circuit of claim 6, further comprising:
a first reset switch coupled to the node and to the supply voltage rail, wherein the first reset switch is configured to be controlled by a reset signal; and
a second reset switch coupled to the discharge transistor and to a common voltage rail, wherein the second reset switch is configured to be controlled by the reset signal;
wherein the first reset switch is turned on with the reset signal at a first polarity and the second reset switch is turned on with the reset signal at a second polarity; and
wherein, when the first reset switch is turned on by the reset signal, current is caused to flow from the power supply rail through the first reset switch and to the capacitive device to thereby increase the voltage on the node.

10. A delay circuit, comprising:
a precharge transistor coupled to a supply voltage rail and configured to receive an input signal;
a resistor coupled to the precharge transistor to thereby form a node, wherein the resistor has a negative temperature coefficient;
a discharge transistor coupled to the resistor and configured to receive the input signal;
a capacitive device coupled to the node;
an inverter coupled to the node and configured to produce an output signal; and
a first reset switch coupled to the node and configured to receive a reset signal;
wherein the precharge transistor is one of a p-channel device or an n-channel device and the discharge transistor is the other of the p-channel device or the n-channel device.

11. The delay circuit of claim 10, wherein:
responsive to the input signal having a first polarity, the precharge transistor is configured to be turned on and the discharge transistor is configured to be turned off to thereby cause current to flow from the supply voltage rail and through the precharge switch to the capacitive device to thereby charge the capacitive device; and
responsive to the input signal having a second polarity, the precharge transistor is configured to be turned off and the discharge transistor is configured to be turned on to thereby cause charge from the capacitive device to discharge through the resistor and through the discharge switch.

12. The delay circuit of claim 11, wherein the capacitive device comprises a transistor.

13. The delay circuit of claim 11, further comprising:
a second reset switch coupled to the discharge switch and to a common voltage rail, wherein the second reset switch is configured to be controlled by the reset signal;
wherein the first reset switch is turned on with the reset signal at a first polarity and the second reset switch is turned on with the reset signal at a second polarity; and
wherein, when the first reset switch is turned on by the reset signal, current is caused to flow from the power supply rail through the first reset switch and to the capacitive device to thereby increase the voltage on the node and cause the output signal from the inverter to change logic state.

14. The delay circuit of claim 11, wherein the negative temperature coefficient of the resistor is equal to, or more negative than, −50 parts per million per unit of temperature.

15. A method, comprising:
configuring a delay circuit for a precharge mode of operation in which a capacitive device is charged thereby forcing a charge node within the delay circuit to be at a logic high level;
detecting a change in an input signal from a logic low to a logic high;
responsive to the detected change in the logic level of the input signal, reconfiguring the delay circuit for a discharge mode of operation in which charge from the capacitive device is discharged through a resistor to a common voltage rail to thereby cause a voltage on the charge node to decrease; and
responsive to a voltage level of the voltage on the charge node becoming a logic low level, changing an output signal from a logic low to a logic high.

16. The method of claim 15, further comprising resetting the delay circuit through operation of a reset transistor coupled to charge the node to thereby force the logic state of the output signal back to the first logic state.

17. The method of claim 15, wherein configuring the delay circuit for the precharge mode comprises:
turning on a precharge transistor coupled between a positive supply voltage rail and the resistor; and
turning off a discharge transistor coupled between the resistor and the common voltage rail.

18. The method of claim 17, wherein reconfiguring the delay circuit for the discharge mode of operation comprises turning off the precharge transistor and turning on the discharge transistor.

* * * * *